(12) United States Patent
Toyota et al.

(10) Patent No.: US 7,288,986 B2
(45) Date of Patent: Oct. 30, 2007

(54) COMMUNICATION SEMICONDUCTOR INTEGRATED CIRCUIT DEVICE AND WIRELESS COMMUNICATION SYSTEM

(75) Inventors: Kenji Toyota, Takasaki (JP); Kazuaki Hori, Yokohama (JP); Kazuhiko Hikasa, Hamura (JP)

(73) Assignee: Renesas Technology Corp., Tokyo (JP)

( * ) Notice: Subject to any disclaimer, the term of this patent is extended or adjusted under 35 U.S.C. 154(b) by 357 days.

(21) Appl. No.: 10/836,197

(22) Filed: May 3, 2004

(65) Prior Publication Data

US 2004/0203553 A1 Oct. 14, 2004

Related U.S. Application Data

(63) Continuation of application No. 10/323,819, filed on Dec. 20, 2002, now Pat. No. 6,750,719.

(30) Foreign Application Priority Data

Jan. 28, 2002 (JP) ............................. 2002-018888

(51) Int. Cl.
*H03G 3/20* (2006.01)
(52) U.S. Cl. ..................... 330/129; 330/279; 330/285
(58) Field of Classification Search ................ 330/129, 330/278, 279, 285, 296
See application file for complete search history.

(56) References Cited

U.S. PATENT DOCUMENTS

| 6,049,252 A | 4/2000 | Iwata ......................... 330/254 |
| 6,175,279 B1 | 1/2001 | Ciccarelli et al. ........... 330/285 |
| 6,278,325 B1 | 8/2001 | Juang ......................... 330/285 |
| 6,847,807 B1 * | 1/2005 | Fujiki ..................... 455/232.1 |

* cited by examiner

*Primary Examiner*—Khanh Van Nguyen
(74) *Attorney, Agent, or Firm*—Mattingly, Stanger, Malur & Brundidge, P.C.

(57) ABSTRACT

The present invention provides a communication semiconductor integrated circuit device equipped with a high-frequency power amplifier circuit including a gain control amplifier and a bias circuit which supplies such a bias current as to linearly change the gain of the gain control amplifier, and a wireless communication system using the same. A bias current generating circuit which supplies a bias current to a linear amplifier that constitutes the communication high-frequency power amplifier circuit, comprises a plurality of variable current sources respectively different in current value and start level. These variable current sources are controlled according to an input control voltage and thereby combine their currents into a bias current. The combined bias current changes exponentially with respect to the input control voltage.

16 Claims, 8 Drawing Sheets

COMMUNICATION SEMICONDUCTOR INTEGRATED CIRCUIT DEVICE AND WIRELESS COMMUNICATION SYSTEM This is a continuation of U.S. Ser. No. 10/323,819, filed on Dec. 20, 2002 now U.S. Pat. No. 6,750,719.

BACKGROUND OF THE INVENTION

This invention relates to a technology for enhancing controllability of output power based on a power control signal voltage of a high-frequency power amplifier circuit and gain's linear characteristics of a gain control amplifier, and particularly to a communication semiconductor integrated circuit device having a high-frequency power amplifier circuit built therein, and a technology effected if applied to a wireless communication system such as a cellular phone or the like with the communication semiconductor integrated circuit device built therein.

A high-frequency power amplifier circuit has been built in an output unit provided on the transmitting side of a wireless communication system (mobile communication system) such as a mobile phone, a cellular phone or the like. The high-frequency power amplifier circuit has a configuration wherein a semiconductor amplifying element corresponding to a final stage comprises a discrete part (output power MOSFET or the like) and a gain control amplifier called a linear amplifier is connected to a previous stage thereof. The linear amplifier and a bias circuit for supplying a bias current therefor are formed on one semiconductor chip as semiconductor integrated circuits.

A system has been generally configured such that a cellular phone makes a phone call while changing an output (transmission power) so as to adapt to a surrounding environment according to a power level instruction signal sent from a base station in accordance with a use environment and avoids interference with other cellular phones. A high-frequency power amplifier module corresponding to an output stage on the transmitting side of a cellular phone of, for example, a North American 900 MHz-band standard system, a GSM (Global System for Mobile Communication) or the like has a configuration wherein a gate bias voltage of an output power element is controlled so as to reach output power necessary for calling according to a control voltage VAPC outputted from an APC (Automatic Power Control) circuit.

Meanwhile, a cellular phone of a conventional GSM or DCS (Digital Cellular System) is generally configured such that a gain control amplifier selects gain stepwise. In a cellular phone of a CDMA (Code Division Multiple Access) system on the other hand, a gain control amplifier, particularly, an amplifier for controlling the level of a transmit signal needs to linearly control gain. To this end, a linear gain converting circuit has been used which supplies such a bias current as to linearly change the gain of the amplifier with respect to an output control voltage VAPC supplied from a baseband circuit or the like, to the amplifier.

It is necessary that the bias current outputted from the linear gain converting circuit changes exponentially with respect to the control voltage VAPC. Thus, a linear gain converting circuit might be conventionally used which comprises a bipolar transistor Qa, a constant voltage source VBB for supplying a base potential to the bipolar transistor Qa according to a control voltage VAPC, and an attenuating amplifier ABB such as shown in FIG. 8 by way of example. The attenuating amplifier ABB is used because a variable range of the control voltage VAPC is about 0V to about 2V whereas a variable range of the base voltage of the transistor Qa is low as in a range of 0.7V to 0.9V.

SUMMARY OF THE INVENTION

While the bias circuit shown in FIG. 8 is configured such that the base voltage is controlled through the use of an exponential change in current flowing through a base-to-emitter PN junction of the transistor to thereby change an output current Iout exponentially with respect to the control voltage VAPC, the bias circuit is very sensitive to variations in base-to-emitter voltage VBE of the transistor Qa and variations in the gain of the attenuating amplifier ABB. It has therefore been found that a problem arises in that the bias current Iout of the linear amplifier greatly changes due to variations in manufacture of each transistor and a variation in temperature, so that the relationship between the control voltage VAPC and the gain of the linear amplifier is not held constant and a gain variable range varies depending on products.

An object of the present invention is to enhance gain's linear characteristics of a gain control amplifier employed in a communication semiconductor integrated circuit device equipped with a high-frequency power amplifier circuit including the gain control amplifier and a bias circuit for supplying such a bias current as to linearly change the gain of the gain control amplifier, and a wireless communication system using the communication semiconductor integrated circuit device.

Another object of the present invention is to provide a high-frequency power amplifier circuit which is excellent in controllability of output power based on a power control signal and high in power efficiency.

A further object of the present invention is to provide a wireless communication system and a high-frequency power amplifier circuit using the same, which is capable of prolonging a call time of the wireless communication system and the life of a battery employed therein.

The above, other objects and novel features of the present invention will become apparent from the description of the present specification and the accompanying drawings.

A summary of a typical one of the inventions disclosed in the present application will be described in brief as follows:

A bias current generating circuit, which supplies a bias current to a linear amplifier that constitutes a communication high-frequency power amplifier circuit, comprises a plurality of variable current sources respectively different in magnitudes of their current values and start level. These variable current sources are controlled according to an input control voltage to thereby combine their currents into a bias current. The combined bias current changes exponentially with respect to the input control voltage.

According to the above means, since the currents of the plurality of current sources are combined together without using voltage-current characteristics of a base-to-emitter PN junction of a transistor to thereby realize exponential characteristics of the bias current, a change in bias current due to a variation in base-to-emitter voltage of the transistor with both variations in base-to-emitter voltage of the transistor and a change in temperature with variations in manufacture can be avoided. Consequently, a bias circuit can be realized which supplies a stable and high-accuracy bias current to its corresponding linear amplifier.

DETAILED DESCRIPTION OF THE PREFERRED EMBODIMENTS

Preferred embodiments of the present invention will hereinafter be described in detail with reference to the accompanying drawings.

Figure 1:
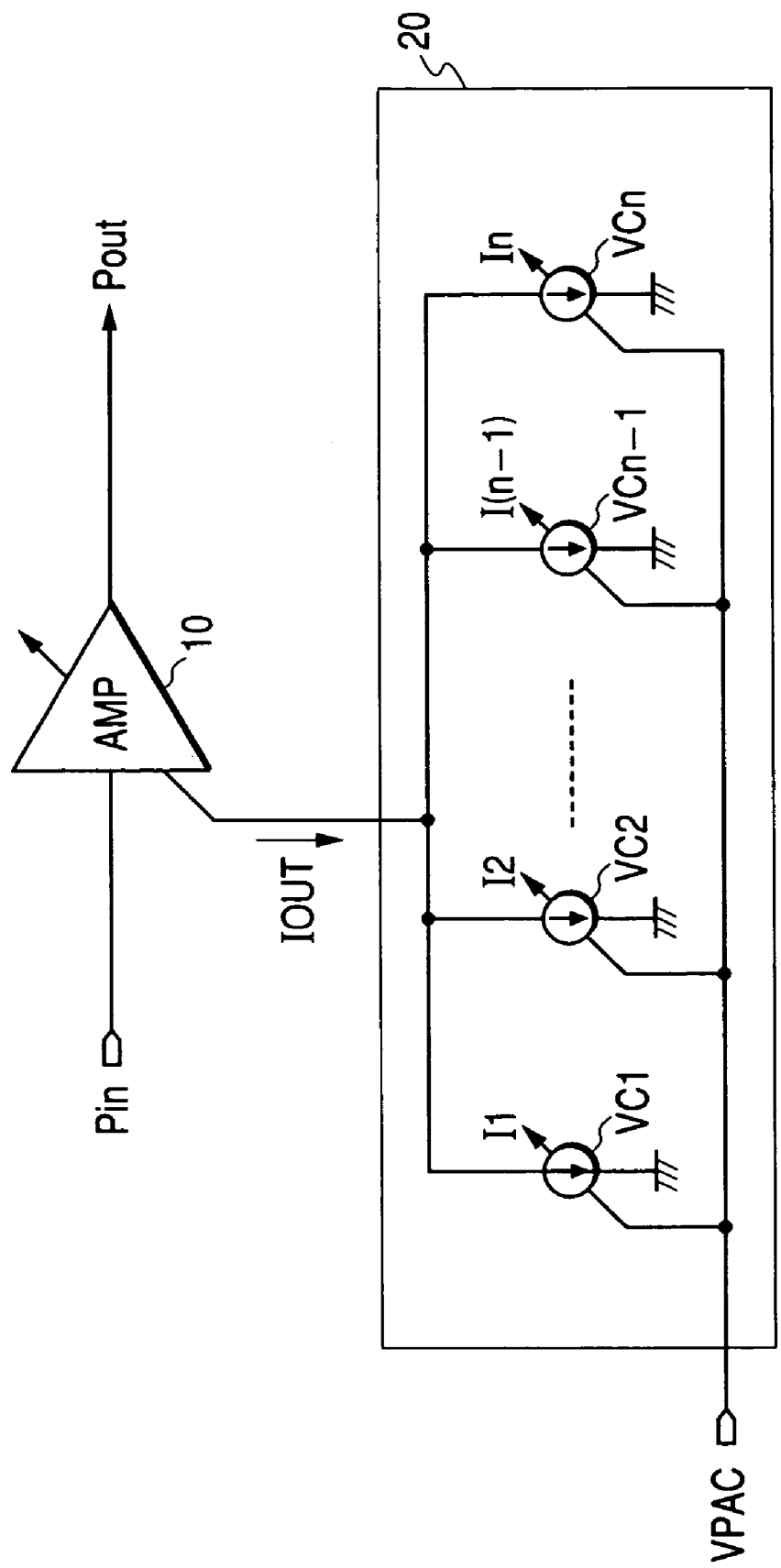
FIG. 1 is a fragmentary configurational diagram of a high-frequency power amplifier circuit showing an embodiment of the present invention.

FIG. 1 schematically shows an embodiment of a bias circuit which generates a bias current supplied to a linear amplifier used as a gain control amplifier that constitutes a communication high-frequency power amplifier circuit. The bias circuit 20 according to the present embodiment is provided with a plurality of variable current sources VC1, VC2, ..., VCn individually different in the magnitude of a current value and current start level. The bias circuit 20 is configured in such a manner that these variable current sources VC1, VC2, ..., VCn are controlled based on an input control voltage VAPC to thereby combine their currents into a bias current, and the combined current varies exponentially with respect to the input control voltage VAPC.

Figure 2A:
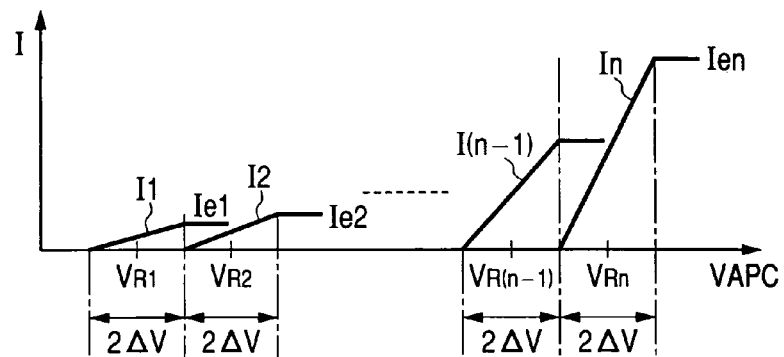
FIG. 2 is a graph showing the relationship between output control voltages obtained in a bias circuit of the high-frequency power amplifier circuit shown in FIG. 1, currents of respective current sources employed therein, and a combined bias current thereof.

Specifically described, the variable current sources VC1, VC2, ..., VCn are respectively configured so as to have such voltage-current characteristics as shown in FIG. 2(A). As the characteristics of the individual variable current sources are understood from FIG. 2(A), the currents respectively vary linearly by ranges of $\pm \Delta V$ with set reference potentials VR1, VR2, ..., VRn as the centers, and a current saturation achieved level of each previous current source is set so as to approximately coincide with a current start level of the next current source, i.e., current variable ranges are set so as not to overlap each other. Further, the inclinations of straight lines, i.e., the rates of changes in currents are set so as to increase in the order of currents I1, I2, ..., In. The bias circuit 20 according to the embodiment combines all the currents I1, I2, ..., In of the variable current sources VC1, VC2, ..., VCn together and allows a current equal to the sum of their current values to flow to a linear amplifier 10 as a bias current Iout. The combined current varies exponentially with respect to the input control voltage VAPC. Thus, the gain (Pout/Pin) of the linear amplifier 10 is controlled so as to linearly change according to the input control voltage VAPC.

Figure 2B:
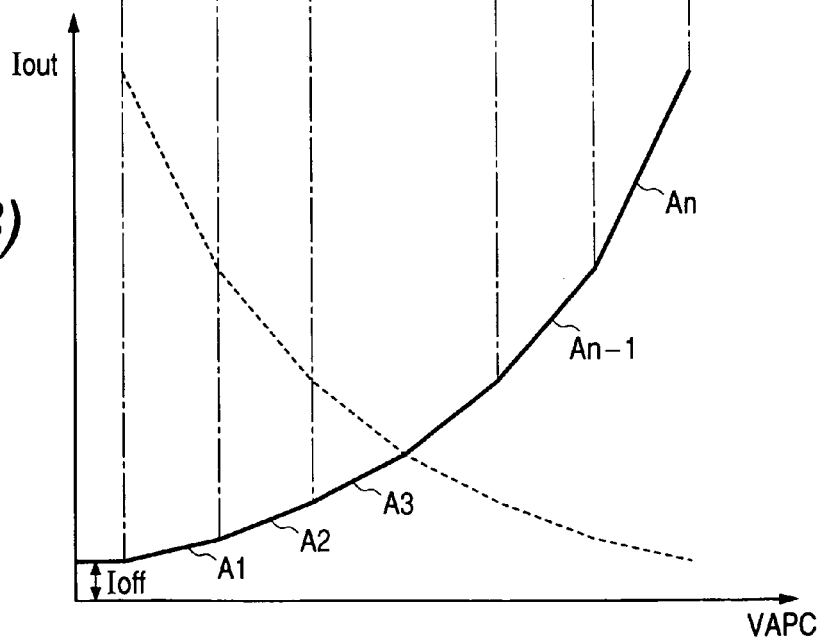

The manner in which the bias current Iout relative to the input control voltage VAPC changes, is represented in FIG. 2(B) in the form of a solid line. As is understood from FIG. 2(B), the bias current Iout changes like a sequential or broken line graph. A first segment A1 corresponds to the current I1 of the current source VC1, the next segment A2 corresponds to one obtained by adding up the currents I1 and I2 of the current sources VC1 and VC2, a segment A3 subsequent to the segment A2 corresponds to one obtained by adding up the currents I1, I2 and I3 of the current sources VC1, VC2 and VC3, and the final segment An corresponds to one obtained by adding up the currents I1, I2, ..., In of all the current sources. In the bias circuit 20 according to the present embodiment, the current values I1, I2, ..., In of the respective variable current sources are set so that the broken line shown in FIG. 2(B) approximates an exponential function.

Figure 3:
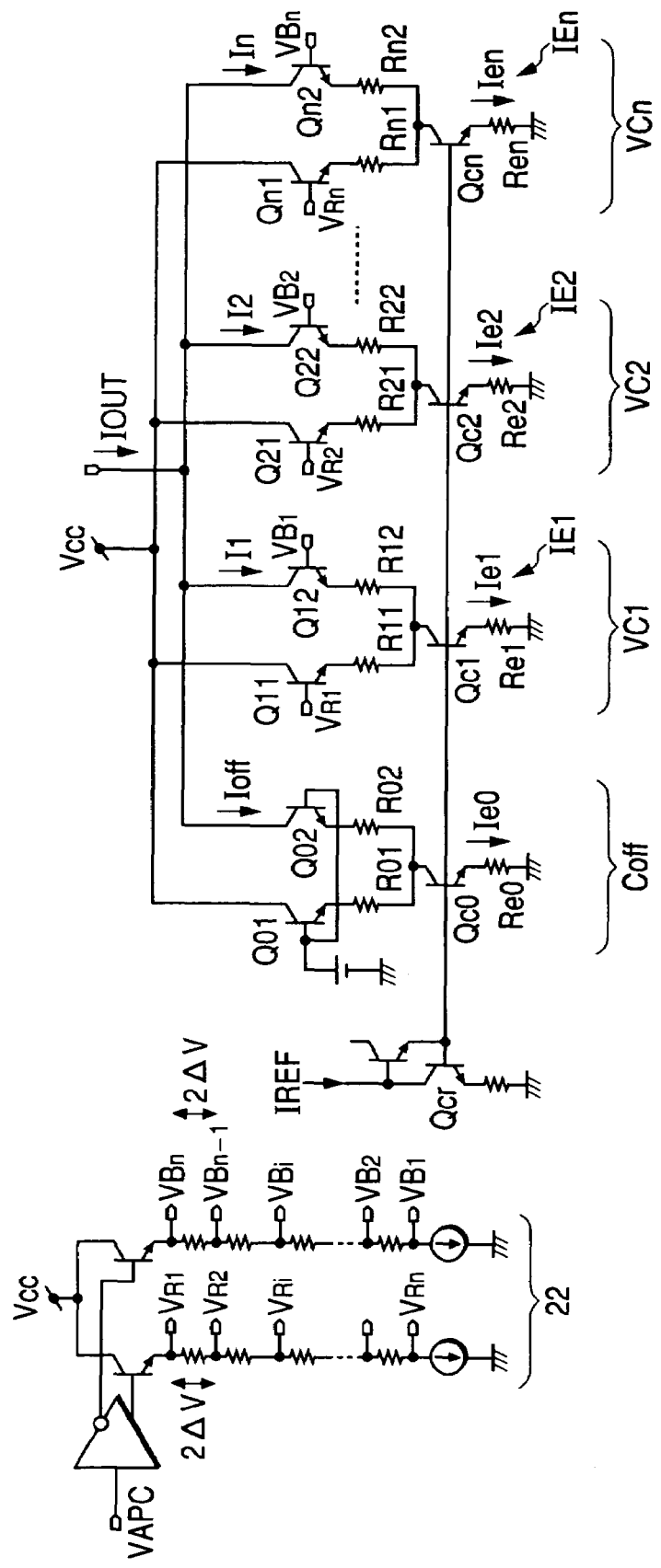
FIG. 3 is a circuit diagram illustrating a specific circuit configuration example of the bias circuit of the high-frequency power amplifier circuit shown in FIG. 1.

A specific circuit example of the bias circuit 20 is shown in FIG. 3. As shown in FIG. 3, the respective variable current sources VC1, VC2, ..., VCn respectively comprise bipolar transistors Q11, Q21, ..., Qn1 having base terminals to each of which any of the reference potentials VR1, VR2, ..., VRn is applied, transistors Q12, Q22, ..., Qn2 which pair up with these transistors respectively, and constant current sources IE1, IE2, ..., IEn connected to their corresponding emitter terminals of the paired transistors like Q11 an Q12, for example, through resistors R11, R12; R21, R22; ...; Rn1, and Rn2. Collector terminals of one paired transistors Q11, Q21, ..., Qn1 are connected to a source or power supply voltage Vcc, whereas collector terminals of the other transistors Q12, Q22, ..., Qn2 are connected in common and configured so as to combine collector currents I1, I2, ..., In of the transistors Q12, Q22, ..., Qn2 to thereby generate a bias current Iout.

There is also provided a resistance type voltage divider 22 for generating base voltages VR1, VR2, ..., VRn of the transistors Q11, Q21, ..., Qn1 and base voltages VB1, VB2, ..., VBn of the transistors Q12, Q22, ..., Qn2 according to a control voltage VAPC for controlling an output level of a linear amplifier 10. Further, a current source Coff comprising transistors Q01 and Q02, resistors R01 and R02, a constant current transistor Qc0 and an emitter resistor Re0 thereof is provided to cause an offset current Ioff to flow aside from the variable current sources VC1, VC2, ..., VCn. The current source Coff is provided to allow the minimal bias current to flow to the linear amplifier 10 even if the control voltage VAPC is 0V.

Constant current sources IE1, IE2, ..., IEn of the respective variable current sources VC1, VC2, ..., VCn respectively comprise bipolar transistors Qc1, Qc2, Qcn and emitter resistances Re1, Re2, ..., Ren. A voltage identical to a base voltage of a transistor Qcr current mirror-connected to these transistors Qc1, Qc2, ..., Qcn and Qc0 is applied to the bases of the transistors Qc1, Qc2, ..., Qcn and Qc0. The constant current sources IEi of the respective variable current sources Vci (where i=1, 2, ..., n) respectively comprise the bipolar transistors Qci and the emitter resistors Rei. Thus, variations in currents due to variations in baseto-emitter voltages VBE of the transistors are reduced as compared with single-transistor current sources each free of an emitter resistor.

A reference current IREF is caused to flow through the transistor Qc0. Thus, currents Ie1, Ie2, . . . , Ien, Ioff proportional to the reference current IREF flow through the respective transistors Qc1, Qc2, . . . , Qcn. Their current values are respectively determined according to the ratios between the size (of an emitter in particular) of the transistor Qc0 and the sizes of the transistors Qc1, Qc2, . . . , Qcn, and the ratio between the resistors Re1, Re2, . . . , Ren. The currents Ie1, Ie2, Ien that flow through the respective transistors Qc1, Qc2, . . . , Qcn, result in saturation currents of the respective variable current sources VC1, VC2, . . . , VCn of the bias circuit shown in FIG. 1. The rates of changes in currents (the inclinations of the segments A1, A2, An in FIG. 2(B)) are respectively determined by the resistance values of the resistors R01, R02; R11, R12; . . . ; Rn1 and Rn2. Further, the current variable range ±ΔV of each of the variable current sources VC1, VC2, . . . , VCn is determined according to the difference in base potential between the paired transistors.

That is, the resistance type voltage divider 22 generates the base voltages VR1, VR2, . . . , VRn of the transistors Q11, Q21, . . . , Qn1 and the base voltages VB1, VB2, . . . , VBn of the transistors Q12, Q22, . . . , Qn2 so that the differences in base potentials among the paired transistors become 2ΔV. The ratios between the resistors constituting the resistance type voltage divider 22 are set such that crossover potentials of the voltages VR1, VR2, . . . , VRn and VB1, VB2, . . . , VBn varied according to the control voltage VAPC reach center potentials V1, V2, . . . , Vn of respective-current waveforms shown in FIG. 2.

The bias circuit according to the present embodiment has the advantage that since the rates of changes in currents of the respective variable current sources VC1, VC2, . . . , VCn are determined by the resistance values of the resistors R01, R02; R11, R12; . . . ; Rn1 and Rn2, the respective resistance ratios are substantially constant even if the resistors vary, so that the exponential curve of the bias current Iout outputted as the combined current shown in FIG. 2(B) remains almost unchanged.

Figure 4:
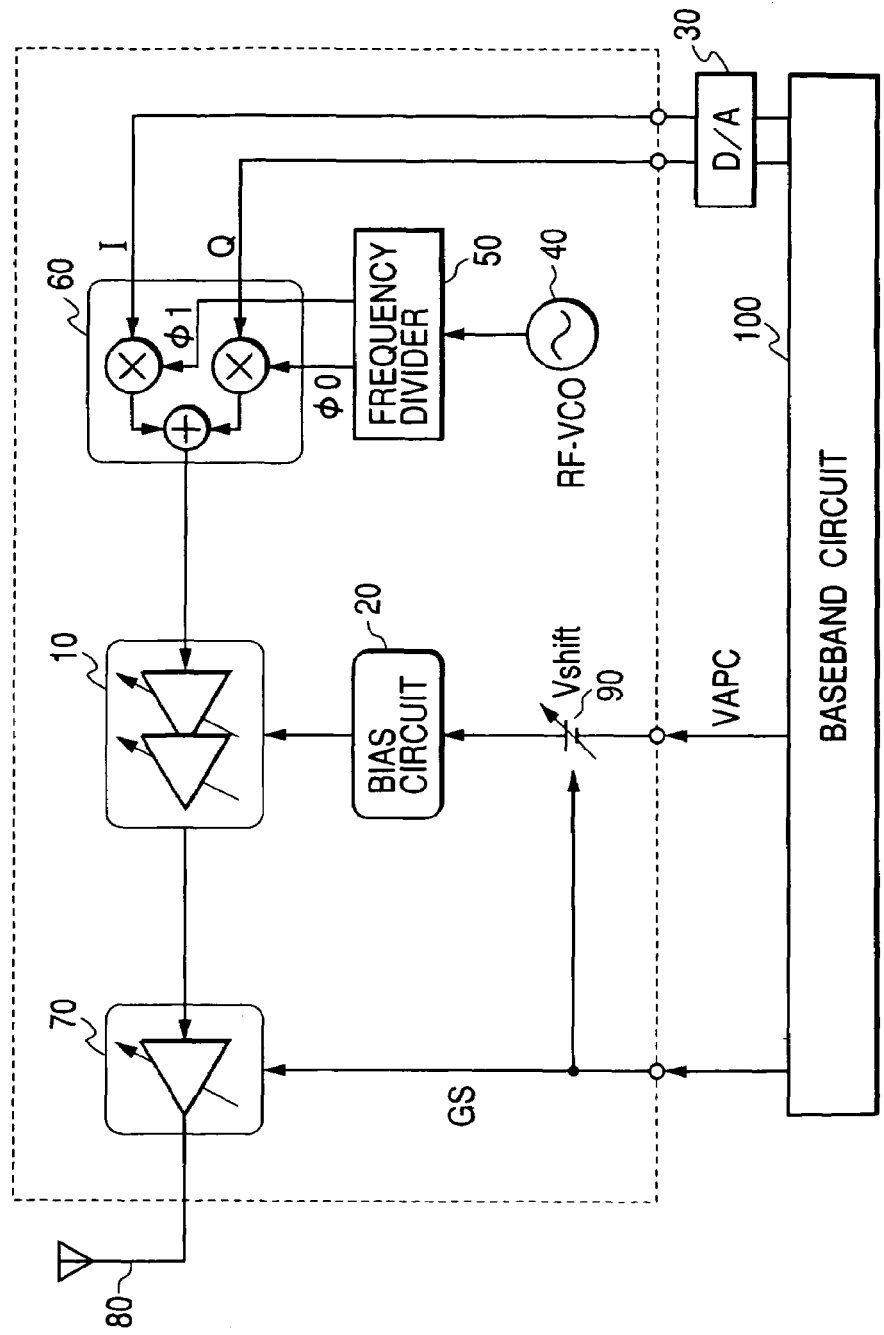
FIG. 4 is a block diagram depicting a configuration example of a transmission-system circuit of a cellular phone suitable for application of the bias circuit according to the embodiment of the present invention.

FIG. 4 shows a configuration of a transmission-system circuit of a CDMA cellular phone suitable for application of the high-frequency power amplifier circuit having the linear amplifier 10 and the bias circuit 20 shown in FIG. 1. In FIG. 4, a circuit block surrounded by a broken line is formed on a single semiconductor chip like monocrystalline silicon as a semiconductor integrated circuit device. However, an output power amplifier 70 corresponding to a final stage may be configured as a discrete IC.

As shown in FIG. 4, the transmission-system circuit of the cellular phone according to the present embodiment comprises a baseband circuit 100 which performs a baseband signal process, control on the whole system, etc., a D/A converter 30 which converts I/Q transmit data code-diffused by the baseband circuit 100 to an analog signal, an oscillator (VCO) 40 which generates a local oscillation signal for modulation, a divided phase circuit 50 which ½-divides the local oscillation signal generated by the oscillator 40 and generates oscillation signals φ1 and φ0 whose phases are shifted 90° from each other, a modulator 60 which effects quadrature modulation on the oscillation signals φ1 and φ0, based on the I an Q signals, a linear amplifier 10 which power-amplifies the modulated signal, a bias circuit 20 which supplies a bias current for the linear amplifier 10, a power amplifier 70 which further amplifies the signal ampli-fied by the linear amplifier 10, etc. The signal amplified by the power amplifier 70 is transmitted through an antenna 80. The D/A converter 30 can be configured on one semiconductor chip together with the baseband circuit 100 as a semiconductor integrated circuit device.

Figure 8:
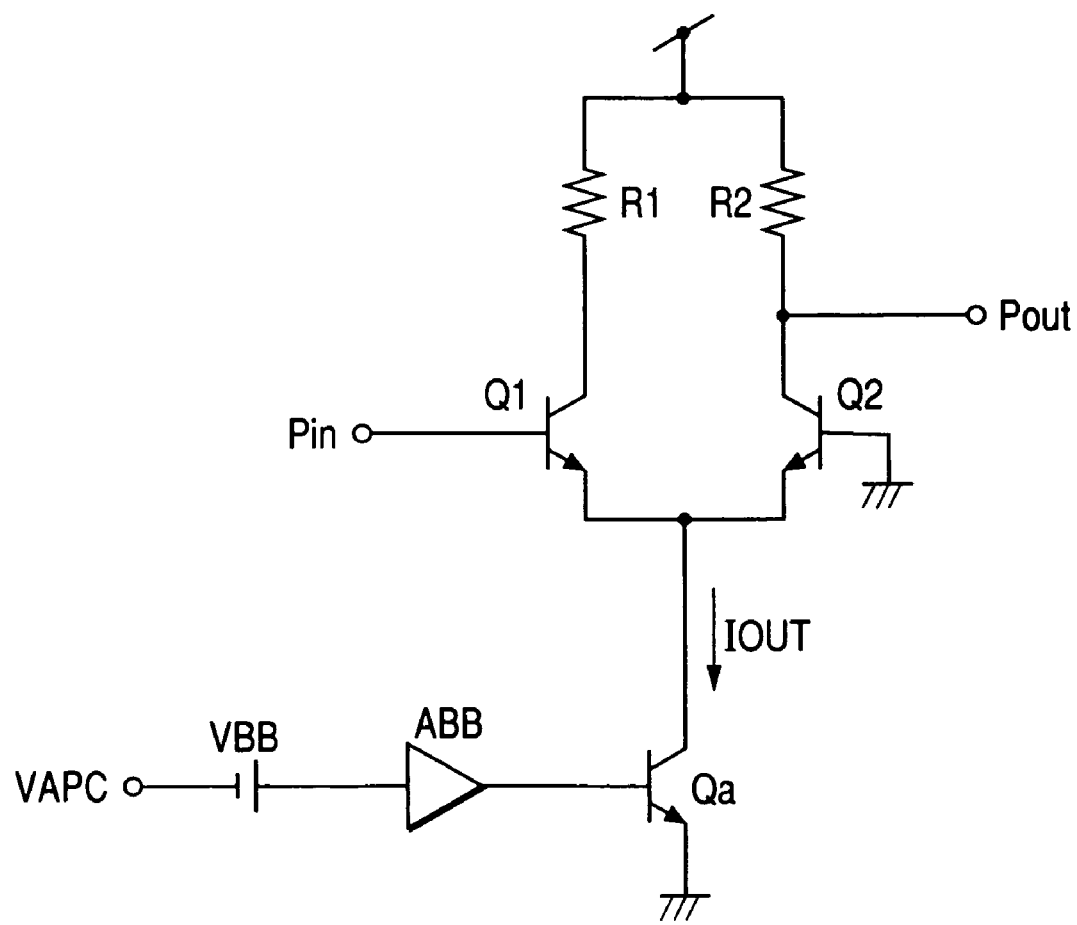
FIG. 8 is a circuit configuration diagram illustrating one example of a bias circuit employed in a conventional high-frequency power amplifier circuit.

In the present embodiment, although not restricted in particular, the linear amplifier 10 is configured such that differential amplifier circuits each comprising transistors Q1 and Q2 shown in FIG. 8 are cascade-connected in two stages and the bias current Iout that changes exponentially according to the control voltage VAPC, is supplied from the bias circuit 20 to the respective amplifier circuits. Thus, the gain of the linear amplifier 10 can be varied from 0 dB to 55 dB according to the control voltage VAPC.

A level shifter 90 for shifting the level of the control voltage VAPC in a negative direction is provided in a stage prior to the bias circuit 20 in the transmission-system circuit according to the embodiment shown in FIG. 4. The output power amplifier 70 provided in a stage subsequent to the linear amplifier 10 is configured so as to switch the gain thereof to two stages of 0 dB and 20 dB. According to a gain switch control signal GS outputted from the baseband circuit 100, the level shifter 90 shifts the level of the control voltage VAPC supplied to the bias circuit 20 in accordance with the timing provided to switch the gain of the power amplifier 70 from 0 dB to 20 dB, so that the total gain of the linear amplifier 10 and the power amplifier 70 can be linearly changed from 0 dB to 75 dB according to the control voltage VAPC. It is thus possible to reduce total power consumption.

Figure 5:
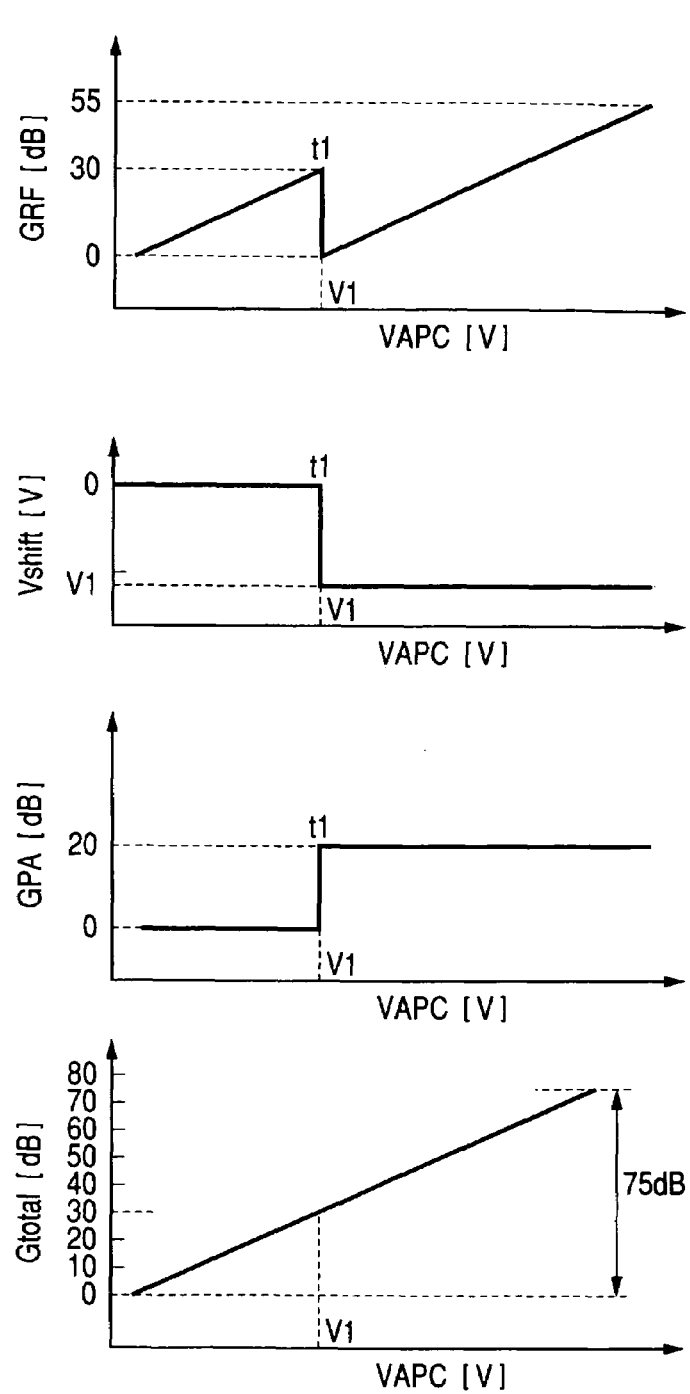
FIG. 5 is a graph showing the relationship between an output control voltage, gain of a linear amplifier and gain of a power amplifier employed in a system shown in FIG. 4.

Described specifically, when the control voltage VAPC gradually increases and thereby reaches a level V1 at which the gain GRF of the linear amplifier 10 results in about 30 dB as shown in FIG. 5 (sign t1), the gain GPA of the power amplifier 70 is switched from 0 dB to 20 dB according to the gain switch control signal GS, and the amount of level shift of the level shifter 90 is changed over from 0V to −V1. In doing so, the voltage supplied to the bias circuit 20 results in (VAPC-V1) so that the gain GRF of the linear amplifier 10 changes again from 0 dB. When the gain GRF of the linear amplifier 10 reaches the maximal 55 dB, the total gain Gtotal equivalent to the sum of the gain of the linear amplifier 10 and the gain of the power amplifier 70 is controlled so as to reach 75 dB.

The gain of the high-frequency power amplifier circuit necessary for the transmission-system circuit of the cellular phone ranges from about 0 dB to about 75 dB in the case of W-CDMA. There is also considered a method of simultaneously and linearly varying the gain of the linear amplifier 10 and the gain of the power amplifier 70 over the whole range thereof. On the other hand, the power amplifier 70 near the antenna is generally larger than the linear amplifier 10 in power consumption in the high-frequency power amplifier circuit comprising the linear amplifier 10 and the power amplifier 70 as shown in FIG. 4. Therefore, the power amplifier 70 operates at a gain of 0 dB in a range (30 dB or less) in which desired gain is low, if the gain of the power amplifier 70 is switched to the two stages as described above according to the control voltage VAPC. Therefore, the total power consumption can be made less as compared with the case in which both the gain of the power amplifier 70 and the gain of the linear amplifier 10 are changed.

Since the probability that each cellular phone will be used near a base station that may be low in transmit power on the average, is higher than the probability that each cellular phone will be used in a place distant from a base station that needs large transmit power, a reduction in power consumption is enabled if as described above, the gain of the power amplifier 70 is switched to the two stages and the power amplifier 70 is activated at 0 dB in the range in which the desired gain is low. Thus, since efficiency at low output is enhanced in particular and current consumption is reduced, a calling time of the cellular phone and the life of a battery can be made long. Since this tendency is expected to increase from now on as the number of base stations increases, an effect obtained owing to the application of the present invention is further enhanced.

Figure 6:
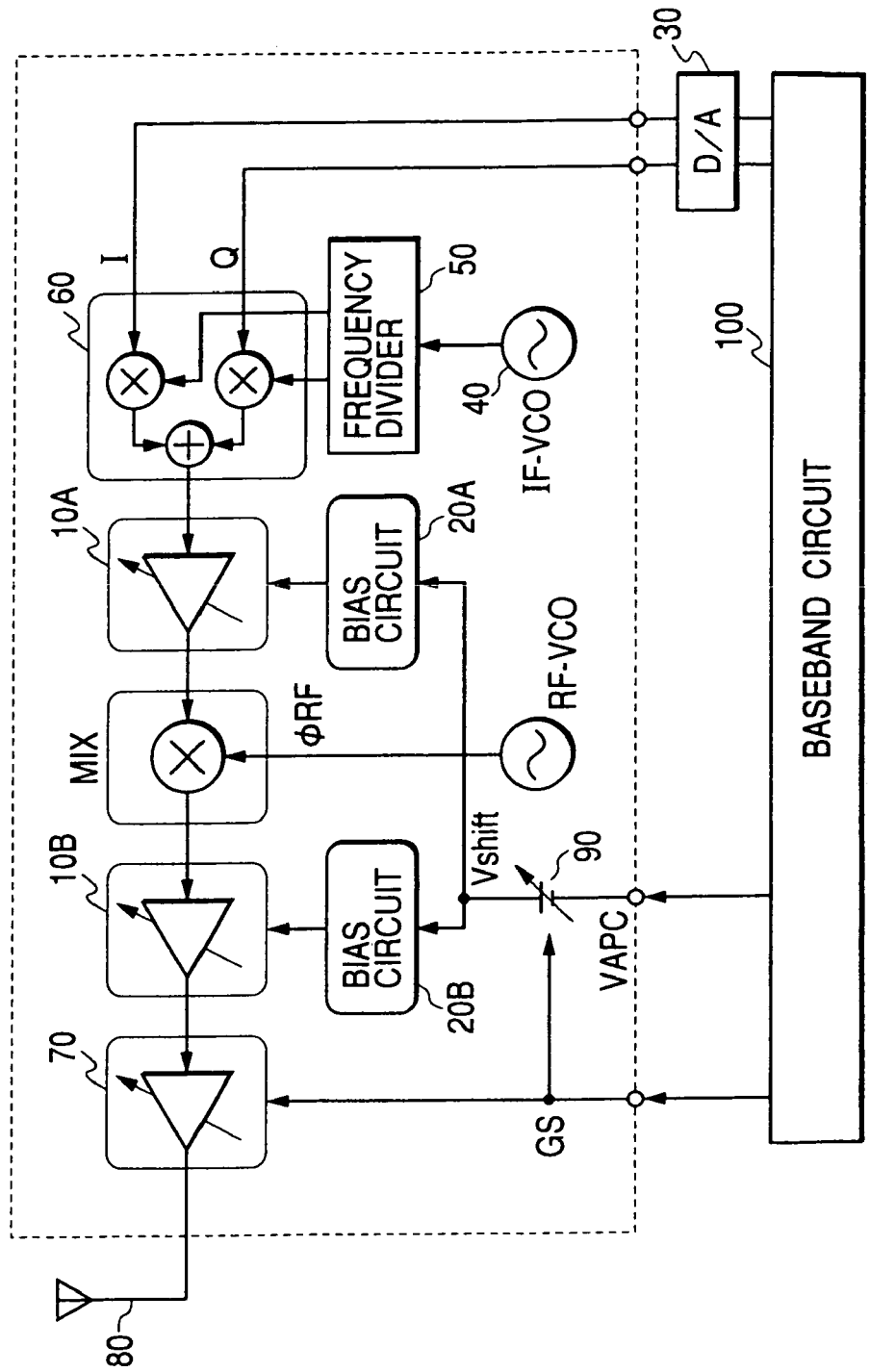
FIG. 6 is a block diagram illustrating another configuration example of a transmission-system circuit of a cellular phone suitable for application of bias circuits according to an embodiment of the present invention.

FIG. 4 has shown the example of the transmission-system circuit employed in the cellular phone of the direct up-conversion system for directly modulating the local oscillation signal of the transmit frequency according to the I/Q transmit signals. FIG. 6 shows an example of a transmission-system circuit employed in a cellular phone of a two-step direct up-conversion system, wherein a local oscillation signal of an intermediate frequency is modulated according to I/Q transmit signals and amplified by a previous-stage linear amplifier 10A, and thereafter an oscillation signal φRF outputted from a high-frequency oscillator (RF-VCO) is combined with the amplified signal by a mixer MIX, and the combined signal is converted to a desired transmit frequency signal, which in turn is amplified by a subsequent-stage linear amplifier 10B and further power-amplified by a power amplifier 70, followed by transmission through an antenna.

When the gain control (FIG. 5) employed in the embodiment shown in FIG. 4 is applied even to this type of cellular phone and thereby a control voltage VAPC reaches a predetermined level V1, the gain GPA of the power amplifier 70 is switched from 0 dB to 20 dB, and the amount of level shift of the level shifter 90 is changed from 0V to −V1. Thus, bias currents Iout outputted from bias circuits 20A and 20B are exponentially controlled to linearly change the gain of the linear amplifier 10A and the gain of the linear amplifier 10B, e.g., allow the linear amplifier 10A to share 20 dB and allow the linear amplifier 10B to share 35 dB, thereby covering 55 dB in total, whereby total gain Gtotal combined together with the gain of the power amplifier 70 can be controlled so as to reach 75 dB.

Incidentally, while FIG. 6 shows the configuration in which the two bias circuits 20A and 20B are provided according to the linear amplifiers 10A and 10B respectively, such a bias circuit as shown in FIG. 3 is provided one alone, and a current mirror circuit may be provided at its output portion so as to supply bias currents Iout1 and Iout2 identical or proportional to each other to the linear amplifiers 10A and 10B.

An embodiment in which the bias circuit of the present invention is applied to a cellular phone having a linear transmission circuit of a polar loop system, will next be explained using FIG. 7. The polar loop is a system called EDGE (Enhanced Data Rates for GMS Evolution) wherein amplitude shift is further added to phase shift of GMSK modulation and is of one architecture of a transmission circuit which performs data communications. It includes two loops: a feedback loop (phase loop) for controlling the phase and a feedback loop (amplitude loop) for controlling the amplitude.

Figure 7:
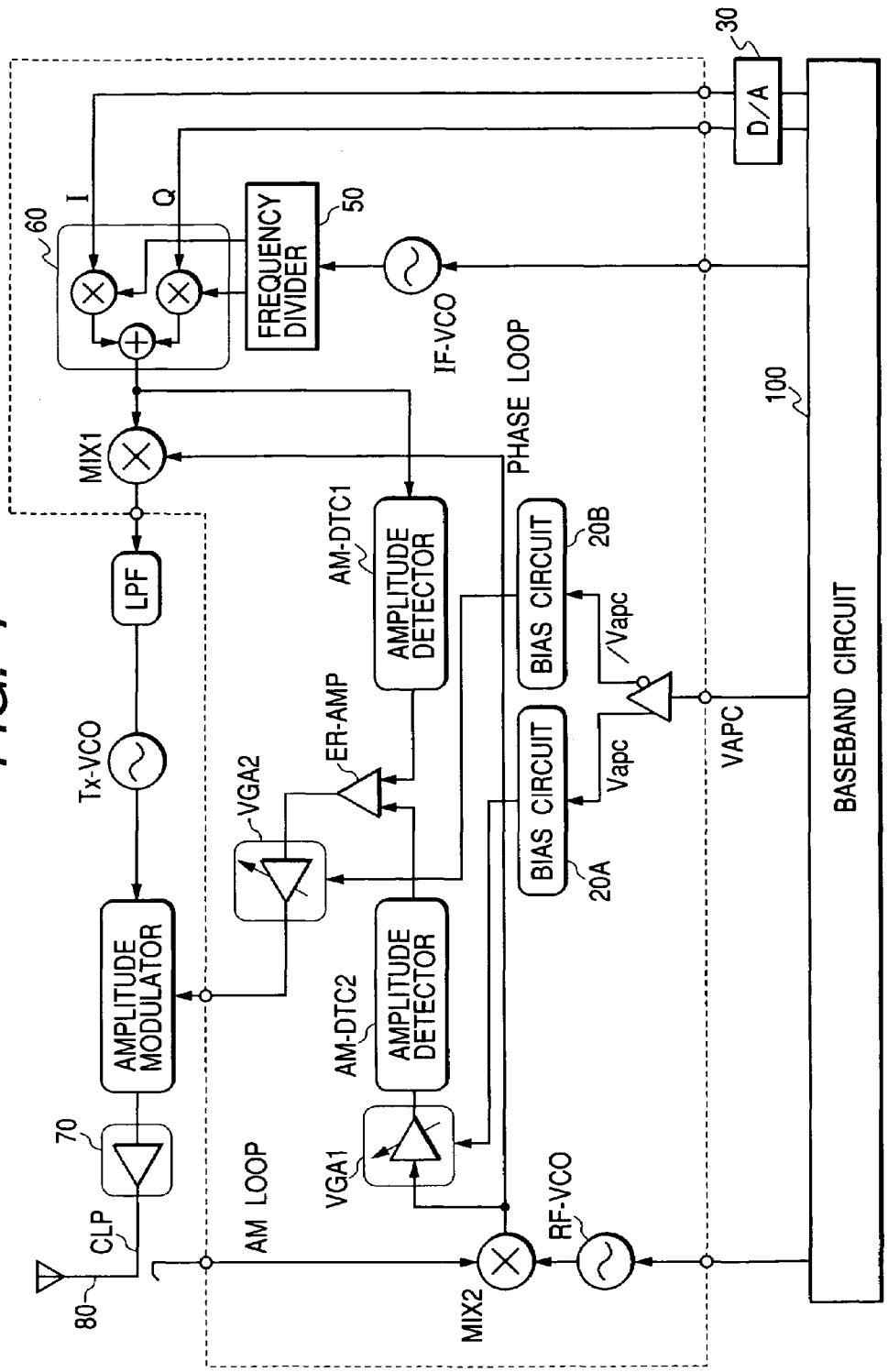
FIG. 7 is a block diagram showing a configuration example of a transmission-system circuit of a polar loop system suitable for application of bias circuits according to an embodiment of the present invention.

The polar loop according to the embodiment of FIG. 7 includes an amplitude detector AM-DTC1 which detects an amplitude component of a phase component and the amplitude component contained in a signal obtained by modulating an intermediate oscillation signal generated by an intermediate frequency oscillator IF-VCO based on I/Q signals in a quadrature modulator 60, a mixer MIX1 which multiplies a modulation signal by a feedback signal to thereby extract the phase component, a low-pass filter LPF which effects a band restriction on the output of the mixer MIX1 to thereby generate a dc voltage, a transmitting oscillator Tx-VCO which generates a transmit signal, an amplitude modulator AM-MOD which amplitude-modifies the transmit signal, a coupler CPL which detects an output level of a power amplifier 70, a mixer MIX2 which combines the output of the coupler CPL and an oscillation signal of an RF-VCO, a gain control amplifier VGA1 which amplifies the output of the mixer MIX2, an amplitude detector AM-DTC2 which detects an amplitude component from the amplified signal, an error amplifier ER-AMP which amplifies an error between the output of the amplitude detector AM-DTC2 and the output of the amplitude detector AM-DTC1, a gain control amplifier VGA2 which amplifies the output of the error amplifier ER-AMP and feeds back it to the amplitude modulator AM-MOD, etc.

The above-described coupler CPL, mixer MIX2, gain control amplifier VGA1, amplitude detector AM-DTC2, error amplifier ER-AMP, and amplitude modulator AM-MOD constitute an amplitude control loop. A phase control loop is configured which feeds back the output of the mixer MIX2 to the mixer MIX1 to thereby lock the phase. Described specifically, when a phase difference occurs between the output signal of the modulator 60 and the feedback signal outputted from the mixer MIX2, such a voltage as to reduce the difference is supplied to its corresponding frequency control terminal of the transmitting oscillator Tx-VCO, so that the phase of the feedback signal sent from the mixer MIX2 coincides with that of the output signal of the modulator 60. Owing to such a phase loop, such control that the phase of the output of the transmitting oscillator Tx-VCO is not shifted with respect to a variation in power supply voltage or a change in temperature, is carried out. Incidentally, the amplitude of the output of the transmitting Tx-VCO is constant.

In the amplitude control loop, the feedback signal obtained by converting the output of the power amplifier 70, which has been detected by the coupler CPL, to an intermediate frequency band (IF) by means of the mixer MIX2, is amplified by the gain control amplifier VGA1 and then detected by the amplitude detector AM-DTC2, from which the corresponding amplitude component is outputted. On the other hand, the transmit signal modulated by the phase modulator 60 is detected by the amplitude detector AM-DTC1 from which the corresponding amplitude component is outputted. The amplitude component of the transmit signal detected by the amplitude detector AM-DTC1 and the amplitude component of the feedback signal detected by the amplitude detector AM-DTC2 are compared by the error amplifier ER-AMP, where an error developed therebetween is amplified. The output of the error amplifier ER-AMP is amplified again by the gain control amplifier VGA2, followed by input to its corresponding amplitude control terminal of the amplitude modulator AM-MOD.

In the present embodiment, the bias circuits 20A and 20B, which supply the bias currents Iout1 and Iout2 corresponding to an output control voltage VAPC to the gain control amplifiers VGA1 and VGA2 are provided in association with the gain control amplifiers VGA1 and VGA2. These bias circuits 20A and 20B are respectively set so as to have a configuration similar to the circuit shown in FIG. 3. However, variable current sources IE1 through IEn are configured in such a manner that only the bias circuit 20A corresponding to the gain control amplifier VGA1 generates such an exponentially-changed bias current Iout1 as indicated by the solid line in FIG. 2 as a voltage-current characteristic, whereas the bias circuit 20B generates a bias current Iout2, as a voltage-current characteristic, which decreases exponentially, i.e., changes such that (logIout1+ logIout2) becomes constant as indicated by the broken line in FIG. 2. Therefore, a differential amplifier D-AMP is provided which generates differential control signals Vapc and/Vapc with respect to the gain control amplifiers VGA1 and VGA2, based to the output control voltage VAPC outputted from a baseband circuit 100. Owing to the provision thereof, the sum of the gain of the gain control amplifier VGA1 and the gain of the gain control amplifier VGA2 is controlled so as to become constant.

In the transmission-system circuit, the amplitude modulator AM-MOD changes the output of the transmitting oscillator Tx-VCO according to the output of the gain control amplifier VGA2. However, when an amplitude error has occurred between the output of the gain control amplifier VGA1 and the output of the phase modulator 60, such a signal as to reduce the error is outputted from the gain control amplifier VGA2. Thus, when the gain of the gain control amplifier VGA1 is attenuated or increased, the output of the amplitude modulator AM-MOD is increased or attenuated correspondingly and hence the amplitude of the feedback signal and the amplitude of the output of the phase modulator 60 coincide with each other.

Since, at this time, the output of the power amplifier 70 results in a signal obtained by amplifying the output constant in amplitude, of the transmitting oscillator Tx-VCO by the amplitude modulator AM-MOD and the power amplifier 70, the gain of the gain control amplifier VGA1 is controlled to thereby make it possible to control the amplitude of the output of the power amplifier 70. Further, the gain of the gain control amplifier VGA2 is controlled so that the sum of the gain of the gain control amplifier VGA1 and the gain of the gain control amplifier VGA2 becomes constant. That is, if the gain of the gain control amplifier VGA1 decreases or increases, then the gain of the gain control amplifier VGA2 increases or decreases by a change in the gain thereof. Controlling the gain in this way makes it possible to prevent oscillations and thereby hold stability of the loop.

As described above, the polar loop is considered to be a system applied to a dual mode transmission circuit corresponding to both GSM and EDGE system because the phase and amplitude of the output of the power amplifier 70 can be accurately controlled owing to synergy between the phase control loop and the amplitude control loop. This is because since the GSM that adopts a GMSK modulation system, causes only a phase component to have transmit information, whereas the EDGE system allows even an amplitude component to have information in order to enhance a transfer rate, the transmission circuit corresponding to the conventional GSM alone is not capable of coping with the amplitude-changing system like the EDGE system because the transmission circuit effects such control that the amplitude of the output of the power amplifier 70 becomes constant. In the polar loop, as previously mentioned, the feedback signal sent from the output of the power amplifier 70 and the output of the phase modulator 60 are compared and the gain is adjusted by the corresponding gain control amplifier. It is therefore possible to control the output (average output power of the power amplifier accurately) of the power amplifier without exerting an influence on the component of modulation of amplitude by the EDGE. Accordingly, the polar loop is capable of simultaneously coping even with the GSM having no modulation component of amplitude.

However, even in the case of both GSM and EDGE system, the output of the power amplifier must be lowered in sensitivity with respect to variations in power supply and temperature, and device variations. According to the standard of the GSM, it is provided that power for a rise (lamp-up) period, a fall (lamp-down) period and a data transmission period must be always held in such a time mask as shown in FIG. 8. It is requested that in the polar loop, an in-loop circuit characteristic is less reduced in variation to control such output power. In particular, the gain control amplifiers VGA1 and VGA2 need to ensure a wide gain variable range (about 50 dB) and restrain variations over its whole range. Therefore, its realization becomes very difficult. If the variations are not allowed, there is also considered a method of bringing or fetching variation information into the baseband circuit and controlling the gains of the gain control amplifiers VGA1 and VGA2 to correct the variations. Since, however, the manufacturing cost of a baseband IC increases in doing so, it is not preferable. It is desirable that since a burden on the baseband circuit increases and its manufacturing cost rises even when the gain of each gain control amplifier is nonlinear with respect to a control signal, gain control becomes linear.

Thus, owing to the use of the bias circuit having such a configuration as described in the embodiment (FIG. 2), gain control amplifiers can be realized each of which ensures a wide gain variable range and is low in sensitivity with respect to variations in power supply and temperature and device variations and also satisfactory in linearity of gain control, and a burden on the baseband circuit can be reduced. It is therefore possible to reduce the manufacturing cost of the baseband IC.

While the invention made above by the present inventors has been described specifically based on the illustrated embodiments, the present invention is not limited to the embodiments. It is needless to say that various changes can be made thereto within the scope not departing from the substance thereof.

While the above description has principally been made of the bias circuits applied to wireless communication systems or apparatuses of CDMA and EDGE systems which belong to the field of application corresponding to the background of the invention, the present invention is not limited thereto. The present invention can be widely used in a bias circuit applied to a wireless communication system or apparatus of such a system as to linearly control a gain control amplifier.

Advantageous effects obtained by typical ones of the inventions disclosed in the present application will be described in brief as follows:

In a communication semiconductor integrated circuit device equipped with a high-frequency power amplifier circuit including a gain control amplifier and a bias circuit for supplying such a bias current as to linearly change the gain thereof, and a wireless communication system using it, a change in bias current due to variations in base-to-emitter voltages of transistors with variations in manufacture, and variations in base-to-emitter voltage with a change in temperature can be avoided. Therefore, a bias circuit can be realized which supplies a stable and high-accuracy bias current to its corresponding gain control amplifier. Thus, the linear characteristics of the gain of the gain control amplifier are enhanced.

A high-frequency power amplifier circuit having gain control amplifiers and an output power amplifier is configured so that the gain of the output power amplifier is switched to two stages. When an output request level is low, the gain of the output power amplifier is switched to a lower level so that the gain is adjusted by the gain control amplifiers alone. Therefore, power efficiency at low output is enhanced. As a result, a cellular phone using the high-frequency power amplifier circuit of the present invention is capable of obtaining the advantage that a calling time and the life of a battery are made long.

What is claimed is:

1. A communication semiconductor integrated circuit device comprising:
   a phase modulation circuit which provides a phase modulated signal in accordance with data to be transmitted;
   an amplitude circuit which provides an amplitude signal in accordance with the data to be transmitted;
   a first gain control amplifier which receives a first bias current, whose gain is determined in accordance with the first bias current, and which receives the amplitude signal and provides an output signal according to the amplitude signal to a circuit which receives the phase modulated signal and forms a transmission signal in accordance with the phase modulated signal and the output signal from the first gain control amplifier; and
   a first bias circuit which receives a first control signal and generates the first bias current to be supplied to the first gain control amplifier according to the first control signal,
   wherein the first bias circuit has a plurality of variable current circuits and the first bias current to be supplied to the first gain control amplifier is formed by combining currents from variable current circuits, and
   wherein the variable current circuits providing the currents to be combined are determined among the plurality of variable current circuits in accordance with the first control signal.

2. A communication semiconductor integrated circuit device according to claim 1, wherein each of the variable current circuits which are determined according to the first control signal and provide a current whose value is determined in accordance with the first control signal.

3. A communication semiconductor integrated circuit device according to claim 2, wherein the first control signal is a control voltage, and wherein each of the variable current circuits provide a current whose value is linearly changed in accordance with the control voltage in a predetermined voltage range of the control voltage.

4. A communication semiconductor integrated circuit device according to claim 3, wherein the combined current is exponentially changed in accordance with the control voltage.

5. A communication semiconductor integrated circuit device according to claim 2, wherein the first control signal is a control voltage, and wherein each of the variable current circuits provides the current whose value is changed at a first changing rate in accordance with the control voltage in a first predetermined voltage range of the control voltage and whose value is changed at a second changing rate in accordance with the control voltage in a second predetermined voltage range of the control voltage, and wherein the first changing rate is larger than the second changing rate and a first predetermined voltage range is different from the second predetermined voltage range.

6. A communication semiconductor integrated circuit device according to claim 5, wherein the variable current circuits includes a first variable current circuit operating in accordance with the control voltage in the first predetermined voltage range of the control voltage and a second variable current circuit operating in accordance with the control voltage in the second predetermined voltage range of the control voltage, whereby the combined current includes the current whose value is changed at the first changing rate and the current whose value is changed at the second changing rate.

7. A communication semiconductor integrated circuit device according to claim 2, wherein the first control signal is a control voltage, and wherein the first bias circuit has an offset current circuit which provides a predetermined current to the first gain control amplifier when the control voltage is "0".

8. A communication semiconductor integrated circuit device according to claim 7, wherein the first gain control amplifier and the first bias circuit are formed on a semiconductor chip.

9. A communication semiconductor integrated circuit device according to claim 2, wherein said amplitude circuit includes:
   a second gain control amplifier which receives a second bias current, whose gain is determined in accordance with the second bias current, and which receives an amplitude component of the transmission signal;
   a second circuit which receives an output of the second gain control amplifier and a signal according to the data to be transmitted and forms the amplitude signal to be supplied the first gain control amplifier; and
   a second bias circuit which receives a second control signal and generates the second bias current to be supplied to the second gain control amplifier according to the second control signal,
   wherein the second bias circuit has a plurality of variable current circuits and the bias current to be supplied to the second gain control amplifier is formed by combining currents from variable current circuits, and
   wherein the variable current circuits providing the currents to be combined are determined from among the plurality of variable current circuits in accordance with the second control signal.

10. A communication semiconductor integrated circuit device according to claim 9, wherein each of the variable current circuits in the second bias circuit which are determined according to the second control signal provides a current whose value is determined in accordance with the second control signal.

11. A communication semiconductor integrated circuit device according to claim 10, wherein the second circuit includes an error amplifier receiving the output of the second gain control amplifier and the signal according to the data to be transmitted and forming the amplitude signal to be supplied the first gain control amplifier.

12. A communication semiconductor integrated circuit device according to claim 11, further including a control signal generating circuit which receives a control signal and generates the first control signal and the second control signal in response to the control signal.

13. A communication semiconductor integrated circuit device according to claim 12, wherein the first gain control amplifier, the amplitude circuit, the first bias circuit, the second circuit and the control signal generating circuit are formed on a semiconductor chip.

14. A wireless communication system comprising:
   a phase modulation circuit which provides a phase modulated signal in accordance with data to be transmitted;
   an amplitude circuit which provides an amplitude signal in accordance with the data to be transmitted;
   a first gain control amplifier which receives a first bias current, whose gain is determined in accordance with the first bias current, and which receives the amplitude signal and generates a signal according to the amplitude signal;

a circuit which receives the phase modulated signal and the signal outputted from the first gain control amplifier, and which forms a transmission signal in accordance with the phase modulated signal and the signal from the first gain control amplifier; and a first bias circuit which receives a first control signal and generates the first bias current to be supplied to the first gain control amplifier according to the first control signal, wherein the first bias circuit has a plurality of variable current circuits and the first bias current to be supplied to the first gain control amplifier is formed by combining currents from variable current circuits, and wherein the variable current circuits providinQ the currents to be combined are determined among the plurality of variable current circuits in accordance with the first control signal.

15. A wireless communication system according to claim 14, wherein each of the variable current circuits which are determined according to the first control signal provides a current whose value is determined in accordance with the first control signal.

16. A wireless communication system according to claim 15, wherein said amplitude circuit includes:

a second gain control amplifier which receives a second bias current, whose gain is determined in accordance with the second bias current, and which receives an amplitude component of the transmission signal;

a second circuit which receives an output of the second gain control amplifier and a signal according to the data to be transmitted and forms the amplitude signal to be supplied the first gain control amplifier; and a second bias circuit which receives a second control signal and generates the second bias current to be supplied to the second gain control amplifier according to the second control signal, wherein the second bias circuit has a plurality of variable current circuits and the bias current to be supplied to the second gain control amplifier is formed by combining currents from variable current circuits, and wherein the variable current circuits providing the currents to be combined are determined among the plurality of variable current circuits in accordance with the second control signal.

* * * * *